United States Patent [19]
Lindqvist et al.

[11] Patent Number: 5,530,929
[45] Date of Patent: Jun. 25, 1996

[54] HOMODYNE RECEIVER MINIMIZING OSCILLATOR LEAKAGE

[75] Inventors: Björn Lindqvist, Bjärred; Martin Isberg, Lund, both of Sweden

[73] Assignee: Ericsson GE Mobile Communications Inc., Research Triangle Park, N.C.

[21] Appl. No.: 303,183

[22] Filed: Sep. 8, 1994

[30] Foreign Application Priority Data

Sep. 9, 1993 [SE] Sweden ................... 9302934

[51] Int. Cl.⁶ ................................................. H04B 1/26
[52] U.S. Cl. ........................ 455/324; 455/310; 455/318
[58] Field of Search ................................ 455/300, 310,
455/301, 313, 314, 317, 318, 323, 324,
255, 258, 260, 315, 296; 331/51, 53

[56] References Cited

U.S. PATENT DOCUMENTS

| | | | |
|---|---|---|---|
| 4,063,173 | 12/1977 | Nelson et al. | 455/315 |
| 4,783,843 | 11/1988 | Leff et al. | 455/315 |
| 5,029,237 | 7/1991 | Ragan | 455/255 |
| 5,146,186 | 9/1992 | Vella | 455/260 |
| 5,187,722 | 2/1993 | Petty | 455/260 |
| 5,241,702 | 8/1993 | Dent . | |
| 5,263,197 | 4/1993 | Manjo et al. | 455/324 |
| 5,361,408 | 11/1994 | Watanabe et al. | 455/317 |

FOREIGN PATENT DOCUMENTS

| | | |
|---|---|---|
| 3240565 | 5/1984 | Germany . |
| 2170368 | 7/1986 | United Kingdom . |
| WO92/01337 | 1/1992 | WIPO . |

*Primary Examiner*—Andrew I. Faile
*Attorney, Agent, or Firm*—Burns, Doane, Swecker & Mathis

[57] ABSTRACT

A method and a device in a homodyne receiver including a local oscillator generating an oscillator signal at a frequency of $f_{LO}$, a mixer, and a reception device for receiving an input signal having a frequency of $f_{RF}$, the oscillator signal and the input signal being supplied to the mixer. The oscillator signal is supplied to a first processing unit to produce a first output signal having a frequency of $M*f_{LO}$, where M is an integer value. The first output signal is supplied to a second processing unit to produce a second output signal having a frequency of $M*f_{LO}/N=f_{LO}$, where N is an integer number and $M \neq N$, and the mixer and the second processing unit are integrated to minimize leakage of signals being supplied to the mixer from the second processing unit.

5 Claims, 1 Drawing Sheet

HOMODYNE RECEIVER MINIMIZING OSCILLATOR LEAKAGE

BACKGROUND

The invention relates to a method and a device in a homodyne receiver to be used in radio, tele, and data communication systems such as portable cellular phones, cordless phones, pagers, carrier frequency systems, TV cable systems, etc. Receivers in this technical field should preferably be small, lightweight and inexpensive.

The first generation of cellular systems relied on analogue frequency modulation for speech transmission, and several standards have been developed, such as NMT450, NMT900, AMPS, and ETACS.

The second generation of cellular systems follows three different standards: in Europe and some countries in Asia and Australia—Global System For Mobile Communications (GSM), in north America—American Digital Cellular (ADC), and in Japan—Pacific Digital Cellular (PDC). These systems all employ digital voice transmission and some digital services such as facsimile transmission and short messages.

To make the portables smaller and less expensive much research has been done to increase the level of integration of different parts in the phone.

Prior art receivers that have been used in this technical field were of the conventional heterodyne type. For applications in small low cost mobile communication systems these receivers suffer from high production costs caused by expensive and non-integrable RF and IF components such as band pass filters. To overcome such drawbacks alternative receivers have been developed. These receivers are based on the direct conversion principle. The local oscillator frequency is equal to the received carrier frequency and, consequently, the received signal is converted to the base band in one single step. This concept was first introduced for SSB-receivers but can be used in many different types of modulation, particularly for digital quadrature modulation schemes.

In a homodyne receiver or a zero-IF-receiver the received signal and the local oscillator operate at exactly the same frequency. Since there are no intermediate frequencies (IF) many filters can be omitted or simplified. The operation of the homodyne receiver can be described as follows. The RF signal of center frequency $f_c$ and bandwith $BW_{rf}$ is amplified with a low noise amplifier to improve the total noise figure of the receiver. The signal is then split and down converted to DC by mixers in both channels. The down converted spectrum is folded over itself and spans from DC to ½ $BW_{rf}$. The low frequency signals I and Q provided by the mixers are then filtered to remove any adjacent channel and amplified to set the noise floor. The I and Q signals or the quadrature signals will allow basically any type of modulation when an appropriate signal processing is utilized.

A major drawback of direct conversion receivers is spurious emission. The main source of spurious emission in a direct conversion receiver is local oscillator leakage. In an ordinary super heterodyne receiver the local oscillator leakage to the antenna is attenuated by the first receiver bandpass filter. In a direct conversion receiver this is not the case since the local oscillator frequency lies within the passband of this bandpass filter. At least two types of leakage are present in a direct conversion receiver. The first type is wire bound leakage, and a second type is radiated leakage caused by parasitic coupling between leads and/or bonding wires.

Different methods have been suggested to overcome the problems with spurious emissions. WO92/01337 discloses a direct conversion receiver comprising an antenna, a RF-filter, an amplifier and a mixer. A local oscillator, operating at a subharmonic of the received frequency, provides a signal to the mixer. A standard type mixer is used and a normal drawback of such a mixer, is that harmonics will be generated in the mixer when a signal of a frequency lower than the received signal is fed to the mixer from the LO is utilized to obtain the wanted signal in the mixer. Even though the local oscillator operates at a subharmonic of the received signal also harmonics will be generated. Some of these harmonics will in fact correspond to the received signal, and spurious emission will occur at some level.

In DE 3240565 another type of homodyne receiver is disclosed. The LO of this receiver is a controllable oscillator that generates a signal with a frequency forming a multiple of the receiver frequency. The generated signal is then phase shifted 180° and divided to the frequency of the RF-signal. A major drawback in a receiver having a LO operating at a multiple of the received frequency is the difficulties to obtain the required characteristics of the LO. For instance the power consumption of such an oscillator will be difficult to match to the demands of a low total power consumption of the receiver.

SUMMARY

According to the present invention the problems and drawbacks of direct conversion receivers mentioned above are overcome by the use of a local oscillator, the frequency output thereof being processed in two steps before it is fed to the mixer. Preferably the frequency is both multiplied and divided before being supplied to the mixer. The final processing of the oscillator frequency to obtain the frequency of the received signal is not made until immediately before the mixer, preferably on the same chip as the mixer.

BRIEF DESCRIPTION OF DRAWINGS

Further features, advantages and details of the invention are set forth in the following description, drawings and claims.

DETAILED DESCRIPTION

Figure 1:
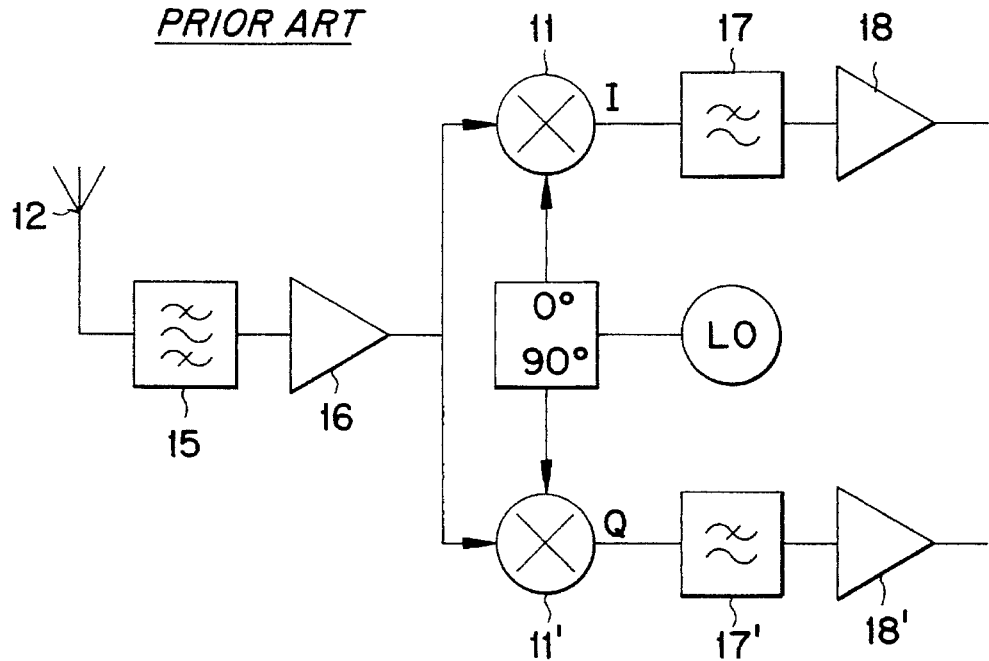
FIG. 1 is a functional block diagram of a prior art homodyne receiver.

In FIG. 1 a prior art homodyne received is shown. In the receiver of FIG. 1 quadrature modulation is utilized. An antenna 12 receives electromagnetic energy transmitted from a transmitter not shown in the drawings. The received signal is fed to a first band pass filter 15, which is provided to select the correct communication band to improve the blocking characteristics of the receiver. Strong signals outside of the received band are attenuated and therefore do not degrade the receiver performance.

An output of said bandpass filter 15 is connected to a low noise amplifier 16 which improves the sensitivity of the receiver. The amplifier gain of said low noise amplifier 16 is selected in view of actual requirements. A high gain results in good sensitivity, and low gain is desirable to achieve a good dynamic range and proper intermodulation characteristics. An output of said low noise amplifier 16 is divided into two different parts, namely an I-channel and a Q-channel.

Each of the I-channel and Q-channel is connected to a mixer 11, 11'. The mixer forms an essential part of the direct conversion receiver. It converts the high frequency input signal to base band where it is easier to amplify and filter the signal with low-pass filters 17, 17' and amplifiers 18, 18'. The mixer, 11, 11' can be passive or active, and the choice between the two depends mostly on the intended application. Passive mixers have good large signal performance and a high third order intercept point but suffer from high conversion losses and the need of a strong local oscillator signal. Therefore, such mixers are avoided in battery powered equipment. An active mixer has a high conversion gain, can be driven by a low power local oscillator but instead has a lower third order intercept point and a slightly poorer noise figure than the passive mixer. In a preferred embodiment an active mixer is used because of the demands for lower power consumption.

Figure 2:
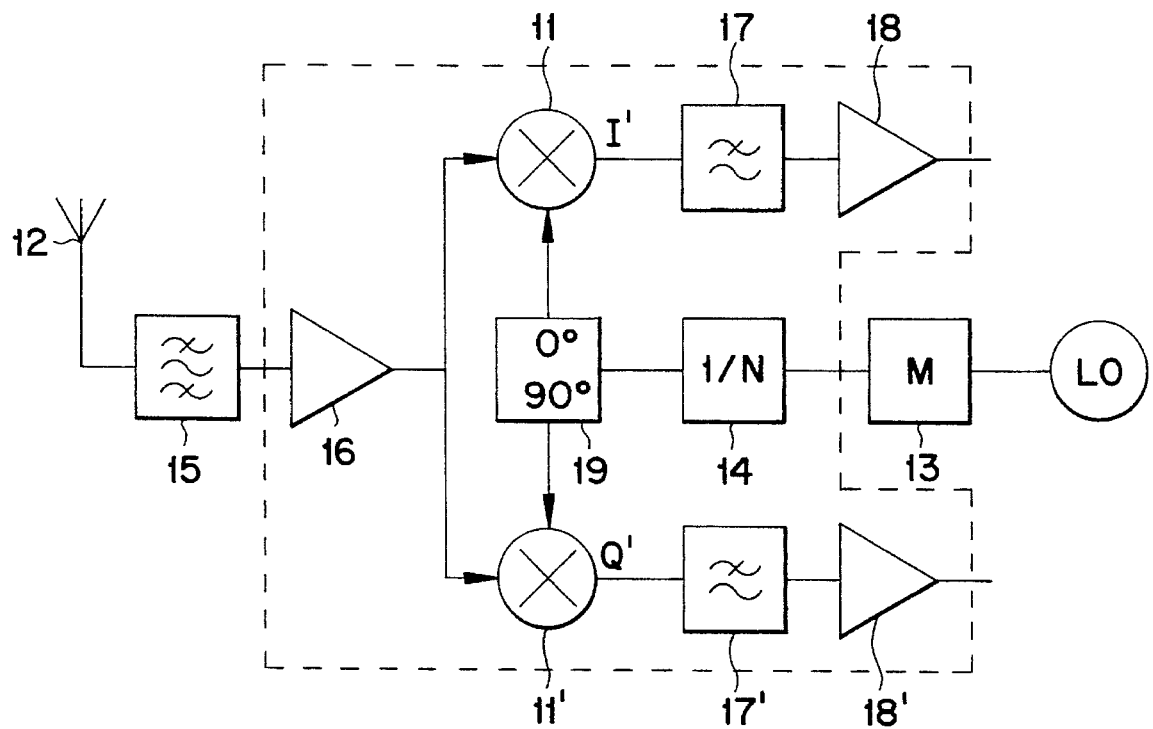
FIG. 2 is a block diagram of a preferred embodiment of a homodyne receiver according to the invention.

As mentioned above a quadrature modulation scheme is preferred according to the present invention. To achieve a quadrature signal mainly two different ways to do it are available. The first is to simply shift the phase of one or both of the I and Q oscillator signals, that is to shift one signal 90° or one +45° and the other −45°. The second method is to use an oscillator that outputs a balanced signal, that is two signals one of which is 180° shifted in phase from the other. These signals are then divided by two in the chain between the local oscillator and the mixers. A half wave length at twice the frequency equals a quarter of a wave length or 90° at the desired frequency, and thus the quadrature signal is generated automatically. According to the present invention the local oscillator operates at a frequency different from the wanted signal or the received signal. Referring to FIG. 2, the LO is connected to a first processing unit 13 which multiplies the frequency of the local oscillator by a factor M. M should be an integer, and preferably is M=3. An output of said first processing unit 13 is operatively connected to a second processing unit 14 in which an input signal is divided by a factor N. M and N are both integer numbers, and furthermore M≠N. Preferably is N=2. FIG. 2 shows that two mixers 11 and 11' are provided, and a phase shift network 19 is operatively connected to said mixers. A first mixer 11 receives the input signal amplified in said amplifier 16 and the output signal of said second processing unit 14, and produces a signal I. The second mixer 11' receives also the output signal of said amplifier 16 and the output signal from said second processing unit 14 phase shifted 90°, and produces a signal Q. However, when N=2 it could be more appropriate to phase shift the output signal within said second processing unit 14.

Output signals I and Q from mixers 11 and 11' are supplied to low pass filters 17, 17' of conventional type and then further amplified in conventional amplifiers 18 and 18'. According to the invention it is not necessary to utilize quadrature signals or the quadrature modulation scheme. In such embodiments the phase shift network 19 is omitted and so are all units denoted by a prime sign.

A main feature of the invention is that signals having a frequency that could cause spurious emissions are not fed through wires such as bonding wires, microstrip, strip lines, coax lines, etc. Therefore, at least said second processing unit 14 should be integrated with said mixers 11, 11'. The integration can be made as an integration in one chip (indicated by the dotted lines in FIG. 2) but also other types of integration having the same characteristics of low emission of electromagnetic signals can be used. In some applications it would be appropriate to integrate also said first processing unit 13 together with said mixers 11, 11' and said first processing unit 14.

Different combinations of M and N are possible. Preferably, N and M are chosen so as to keep the operating frequency of said LO as low as possible to avoid unnecessary power losses. As stated above N is preferably 2, and M is preferably 3 but also the opposite could be an appropriate choice.

The receiver according to the invention obviously can be used also in wired systems and is not restricted to radio communication systems. In a wired system the antenna 12 is replaced by an input circuit or other reception means applicable in such a system.

What is claimed is:

1. A method in a homodyne receiver including a local oscillator generating an oscillator signal at a frequency of $f_{LO}$, a mixer, and reception means for receiving an input signal having a frequency of $f_{RF}$, the oscillator signal and the input signal being supplied to the mixer, comprising the steps of:

(a) supplying the oscillator signal to a first processing unit to produce a first output signal having a frequency of $M*f_{LO}$, where M is an integer value, (b) supplying the first output signal to a second processing unit to produce a second output signal having a frequency of $M*f_{LO}/N=f_{RF}$, where N is an integer number and M≠N, and (c) integrating the mixer and the second processing unit to minimize leakage of signals being supplied to the mixer from the second processing unit.

2. The method of claim 1, wherein the oscillator signal is a balanced output signal, including a first oscillator signal and a second oscillator signal, the second oscillator signal being shifted 180° from the first oscillator signal.

3. The method of claim 1, further comprising the steps of:

phase shifting the second output signal by substantially 90° to produce a phase shifted signal, and supplying the second output signal to the mixer and the phase shifted signal to a second mixer to obtain quadrature signals.

4. A device in a homodyne receiver including a local oscillator for generating an oscillator signal at a frequency of $f_{LO}$, a mixer, and reception means for receiving an input signal having a frequency of $f_{RF}$, the oscillator and the reception means being operatively connected to the mixer, comprising:

a first processing unit operatively connected to the local oscillator for producing a first output signal having a frequency of $M*f_{LO}$, where M is an integer value, and a second processing unit operatively connected to the first processing unit for producing a second output signal having a frequency of $M*f_{LO}/N=f_{RF}$, where N is an integer number and M≠N, wherein the mixer and the second processing unit are integrated to minimize leakage of signals supplied to the mixer from the second processing unit.

5. The device of claim 4, wherein the first processing unit is a multiplier and the second processing unit is a divider circuit.

\* \* \* \* \*